United States Patent
Koyama

(10) Patent No.: US 7,510,404 B2
(45) Date of Patent: Mar. 31, 2009

(54) FIXING STRUCTURE AND CONTROL DEVICE USING THAT FIXING STRUCTURE

(75) Inventor: Takeshi Koyama, Kobe (JP)

(73) Assignee: Fujitsu Ten Limited, Kobe-shi (JP)

( * ) Notice: Subject to any disclaimer, the term of this patent is extended or adjusted under 35 U.S.C. 154(b) by 0 days.

(21) Appl. No.: 10/997,668

(22) Filed: Nov. 24, 2004

(65) Prior Publication Data
US 2005/0118843 A1     Jun. 2, 2005

(30) Foreign Application Priority Data
Nov. 27, 2003   (JP) ............................. 2003-397210

(51) Int. Cl.
*H01R 12/00*    (2006.01)
(52) U.S. Cl. ..................... 439/76.1; 361/752; 180/400; 280/728.2; 280/731
(58) Field of Classification Search ............... 439/76.1; 361/752; 180/400; 280/728.2, 731
See application file for complete search history.

(56) References Cited

U.S. PATENT DOCUMENTS

| | | | | |
|---|---|---|---|---|
| 3,668,476 A | * | 6/1972 | Wrabel et al. ............... | 361/785 |
| 4,392,701 A | * | 7/1983 | Weidler ...................... | 439/76.1 |
| 5,411,401 A | * | 5/1995 | Chiou ........................ | 439/76.1 |
| 5,761,046 A | * | 6/1998 | Hein et al. .................. | 361/752 |
| 6,042,392 A | * | 3/2000 | Tsuji ......................... | 439/76.1 |
| 6,431,884 B1 | * | 8/2002 | Wallace et al. ............... | 439/86 |
| 6,709,291 B1 | * | 3/2004 | Wallace et al. .............. | 439/607 |

FOREIGN PATENT DOCUMENTS

| | | |
|---|---|---|
| CN | 2229385 Y | 6/1996 |
| CN | 2348503 Y | 10/1999 |
| JP | H05-329 | 1/1993 |
| JP | 2000-315877 | 11/2000 |
| JP | 2000-315877 A | 11/2000 |
| JP | 2002-308021 | 10/2002 |

* cited by examiner

*Primary Examiner*—Truc T Nguyen
(74) *Attorney, Agent, or Firm*—Fogg & Powers LLC

(57) ABSTRACT

A fixing structure wherein impact transmitted to a housing is efficiently transmitted to a circuit board and strain etc. generated at the housing are not transmitted to the circuit board. The fixing structure includes a circuit board mounting electronic devices, a housing storing the circuit board in the inside, and a plurality of board mounting seats provided at the housing for fixing the circuit board. Part of the plurality of board mounting seats rigidly mount the circuit board to the housing. Due to this, the impact is transmitted well to the electronic devices. The remaining board mounting seats are formed so as to flexibly mount the circuit board to the housing. Due to this, the strain generated at the housing is no longer transmitted to the circuit board and destruction of the circuit board can be prevented.

4 Claims, 6 Drawing Sheets

FIXING STRUCTURE AND CONTROL DEVICE USING THAT FIXING STRUCTURE

This application claims priority to Japanese Patent Application No. JP-2003-397210 filed on Nov. 27, 2003.

BACKGROUND OF THE INVENTION

1. Field of the Invention

The present invention relates to a fixing structure for fixing in place a circuit board and a housing and a control device using that fixing structure.

2. Description of the Related Art

As an electronic device mounted on a circuit board, for example, there is an impact sensor for detecting impact. Further, there is an impact sensor device accommodating a circuit board on which this impact sensor is mounted in a housing. The impact sensor device detects impact given to the device by the impact sensor mounted on the circuit board and outputs a signal in accordance with the impact.

The impact sensor device is for example used for control of an airbag. In this case, by mounting an airbag ECU together with the impact sensor at the circuit board, an airbag control device detecting a collision of the vehicle and outputting an airbag ignition signal is comprised.

FIGS. 1A and 1B will be used to explain the configuration of an airbag control device of the related art. FIG. 1A shows the inside of the device as seen from the side, while FIG. 1B shows the state of the device as seen from the bottom.

The airbag control device 1 is comprised of a housing 2, a circuit board 3, and a bottom cover 4.

The housing 2 is for example formed by a die-casting etc. The housing 2 is closed at the top surface and the side faces and is open at the bottom surface. At the bottom of the side faces of the housing 2, three mounting brackets 6 are provided for mounting the housing 2 to the vehicle 5.

The inside of the housing 2 is formed with board mounting seats 7 for mounting the circuit board 3 and the bottom cover 4. The board mounting seats 7 are formed as part of the housing 2.

The circuit board 3, while not illustrated, mounts an impact sensor and an airbag ECU and is mounted to the board mounting seats 7 by screws 11 together with the bottom cover 4.

To transmit impact from the vehicle 5 efficiently to the circuit board 3, the mounting brackets 6 and board mounting seats 7 are arranged in proximity. The rigidity from the mounting brackets 6 to the circuit board 3 is therefore increased.

Impact occurring at the vehicle 5 due to collision etc. is transmitted through the mounting brackets 6, housing 2, and board mounting seats 7 to the circuit board 3. The impact sensor mounted on the circuit board 3 detects this and outputs a detection signal to the airbag ECU.

The airbag ECU judges the occurrence of a collision based on the input signal. When judging the occurrence of a collision, it outputs an ignition signal for deploying the airbag for protecting the passenger.

Since the housing 2 is formed by for example a die-casting etc., after formation, warping occurs in the housing 2. In this case, since the mounting surfaces of the mounting brackets 6 are not located on the identical plane, when mounting the housing 2 to the vehicle 5, the mounting surfaces of the mounting brackets 6 are forcibly made to match with an identical plane and any warping that occurs is corrected. As a result, strain occurs in the housing 2. The strain is transmitted to the circuit board 3. Therefore, in the worst case, cracks etc. occur in the circuit board 3.

To solve this problem, a structure for absorbing any warping by forming grooves at the parts where the mounting brackets 6 contact the housing 2 is described in Japanese Unexamined Utility Model Publication (Kokai) No. 5-329.

Further, when impact is transmitted to the circuit board 3, to prevent the impact from destroying the circuit board, the parts connecting the circuit board 3 and the housing 2 are provided with reinforcing ribs and reinforcing angles as described in Japanese Unexamined Patent Publication (Kokai) No. 2000-315877.

However, the method of mounting described in Japanese Unexamined Patent Publication (Kokai) No. 2000-315877 is complex, so a rise in cost is caused.

The housing 2 of the airbag control device 1 has to transmit the impact of the vehicle 5 to the circuit board 3 as it is, so in most products of the related art, as described in Japanese Utility Model Publication (Kokai) No. 5-329, the housing 2 is made of a die-casting with a high material strength. However, recently, due to the trend toward cost reduction, there have been demands for making the housing out of plastic instead of die-castings.

A plastic material is low in material strength compared with a die-casting, so the following problems may be considered when using a plastic housing for an airbag control device.

(1) A plastic housing is flexible, so when the heights of the mounting brackets 6 and the mounting surfaces become misaligned, strain occurs in the housing at the time of mounting to the vehicle. The strain is reflected at the mounting surfaces of the board mounting seats 7 as it is. Therefore, compared with a die-cast housing, the amount of strain to the circuit board becomes greater.

(2) In the case of a die-cast housing, the material is brittle, so when the vehicle body deforms at the time of vehicle collision, the housing 2 is destroyed before the deformation is transmitted to the circuit board 3. As opposed to this, a plastic housing deforms more easily than a die-cast housing, so deformation of the body at the time of collision is transmitted to the circuit board 3 as it is and the circuit board 3 deforms together with it. Therefore, in the worst case, the circuit board is destroyed.

(3) To avoid the state of (2), it may be considered to lower the rigidity between the mounting brackets 6 and the board mounting seats 7. However, in this case, the performance in transmitting impact to the circuit board at the time of impact falls.

The present invention solves the problems (1) to (3) in an impact sensor device or an airbag control device.

SUMMARY OF THE INVENTION

An object of the present invention is to provide a fixing structure used in a control device etc. where impact transmitted to the housing is efficiently transmitted to the circuit board and wherein the strain etc. generated in the housing are not transmitted to the circuit board.

To attain the above object, according to the present invention, there is provided a fixing structure for fixing a board mounting electronic devices and a housing storing the circuit board, wherein the housing is provided with a plurality of board mounting seats formed facing a bottom direction from a ceiling part of the inside of the housing for fixing the circuit board and the housing, part of the plurality of board mounting seats are formed separated from the side walls of the inside of the housing, and the remaining board mounting seats are formed integrally with the side walls of the inside of the housing.

According to the present invention, the impact transmitted to the housing is transmitted to the circuit board as it is. Further, by the formation of the remaining board mounting seats separated from the side walls, the strain generated when producing the housing, the strain generated when mounting the housing, etc. are absorbed at the board mounting seats, so the circuit board will not be deformed.

In the present invention, by providing mounting brackets for the housing to the outside in proximity to the board mounting seats formed integrally with the side walls, the impact can be transmitted to the circuit board even better.

Further, by mounting a connector for connecting the circuit board to the outside to the housing by engagement parts, the circuit board can be mounted to the housing through the connector more rigidly.

Further, by forming at least one strut between the plurality of board mounting seats, it is possible to reinforce the housing, reduce shaking of the housing at the time of impact, and prevent deformation of the circuit board.

Therefore, according to the present invention, even if forming the housing out of plastic, good characteristics can be obtained.

According to the present invention, it is possible to transmit impact transmitted to the housing to the circuit board for mounting the electronic devices in the fixing structure used in a control device etc. and prevent destruction of the circuit board.

BRIEF DESCRIPTION OF THE DRAWINGS

These and other objects and features of the present invention will become clearer from the following description of the preferred embodiments given with reference to the attached drawings, wherein:

FIG. 1A and FIG. 1B are views of the configuration of an impact sensor device of the related art, wherein FIG. 1A shows the inside of the device by a sectional view seen from the side and FIG. 1B shows the device in the state as seen from the bottom;

DESCRIPTION OF THE PREFERRED EMBODIMENTS

Preferred embodiments of the present invention will be described in detail below while referring to the attached figures.

Figure 1A:
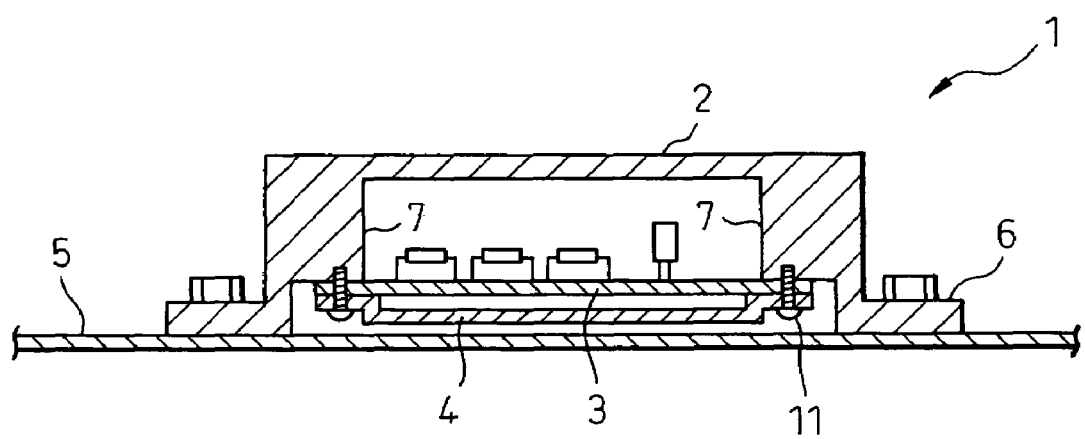
Figure 1B:
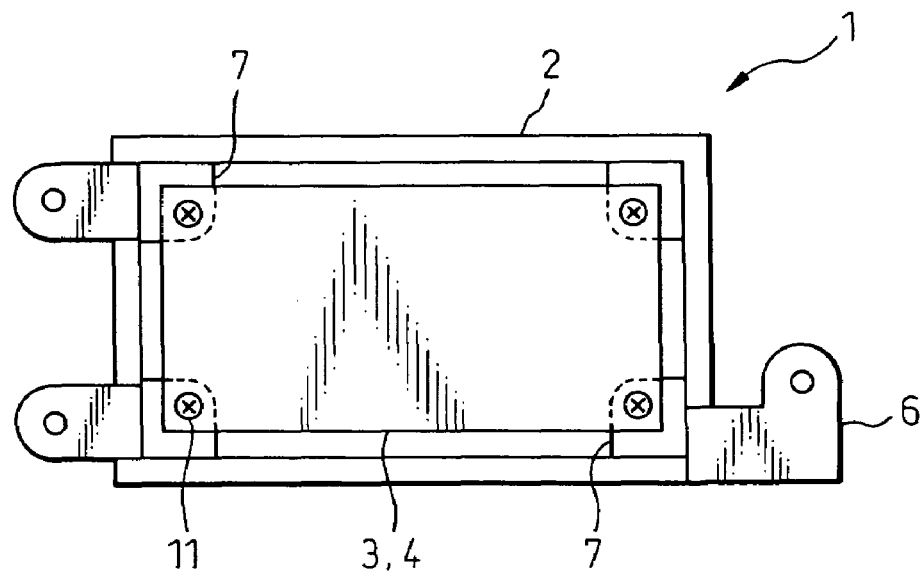
Figure 2:
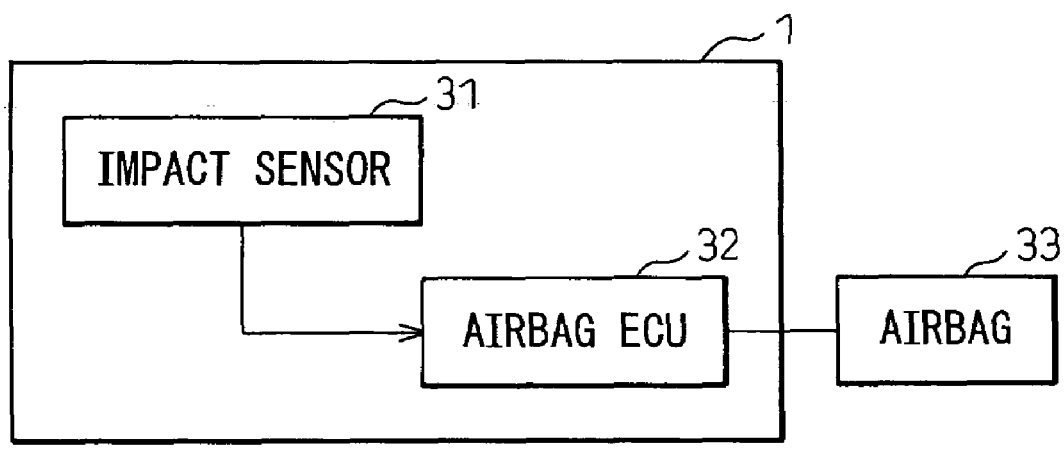
FIG. 2 is a circuit diagram of an airbag control device to which the present invention is applied.
Figure 3:
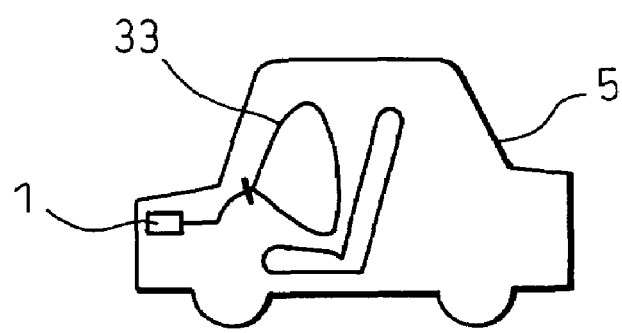
FIG. 3 is a view of the state of the airbag control device of FIG. 2 mounted in a vehicle.

FIG. 2 is a circuit diagram of an airbag control device to which the present invention is applied, while FIG. 3 is a view of the state of the airbag control device of FIG. 2. If collision etc. results in impact to the vehicle 5, the impact sensor 31 detects this and outputs a detection signal to an airbag ECU 32. The airbag ECU 32 judges the existence of collision based on the input signal. When it judges that collision has occurred, it issues an ignition signal for deploying the airbag 33 for protecting the passengers. The operation of the airbag ECU is known, so explanation of it here will be omitted.

Figure 4:
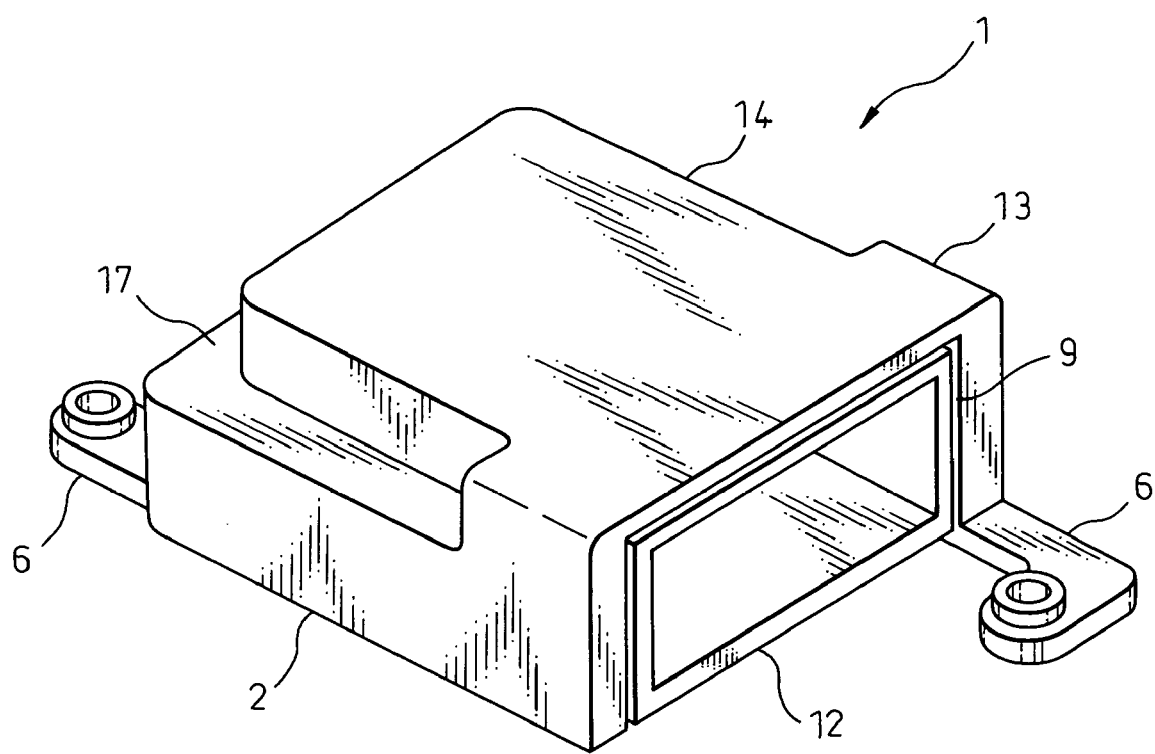
FIG. 4 is an outside perspective view of an impact sensor device to which the present invention is applied.
Figure 5:
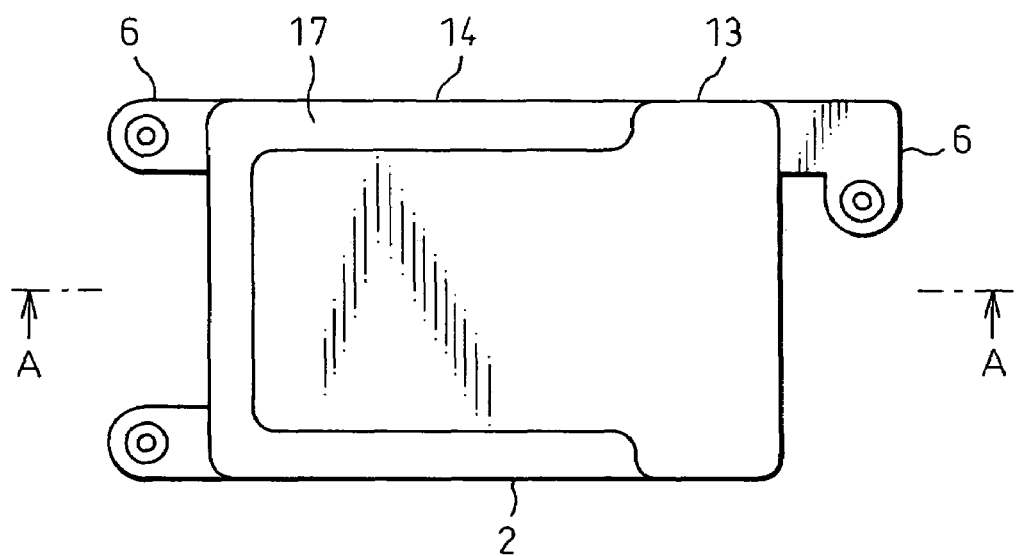
FIG. 5 is a view of the device of FIG. 4 as seen from above.
Figure 6:
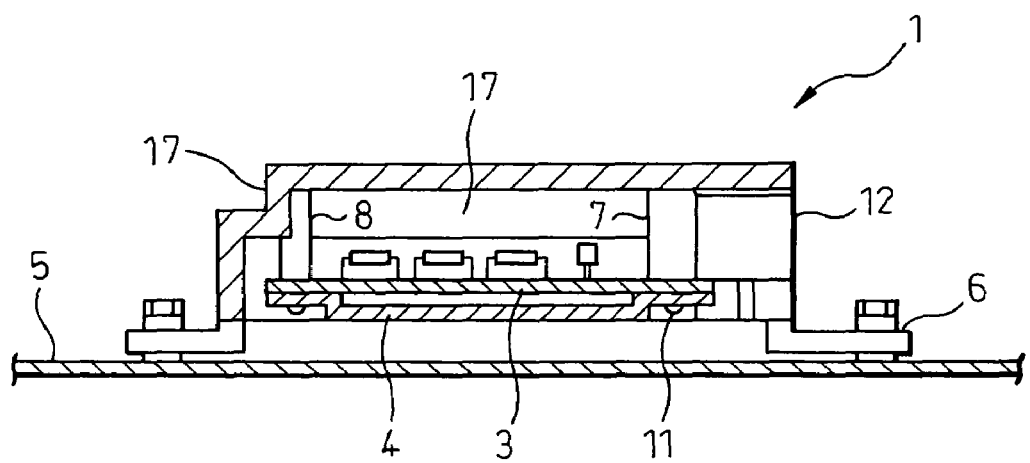
FIG. 6 is a sectional view seen along the line A-A of FIG. 5.
Figure 7:
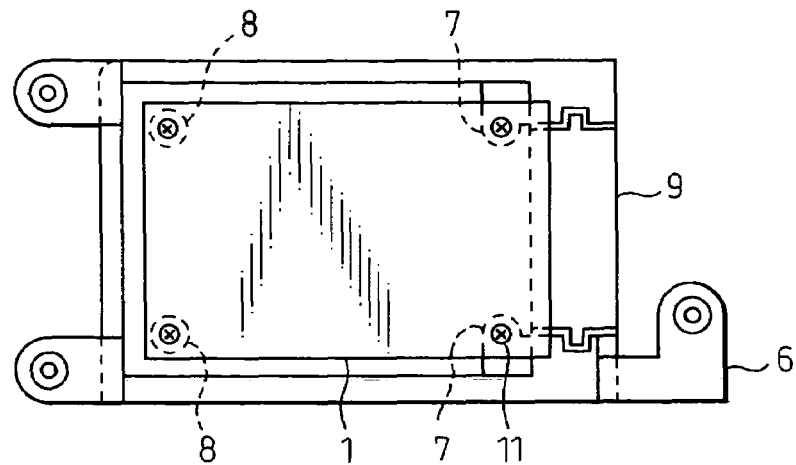
FIG. 7 is a view of the device of FIG. 4 as seen from the bottom.

FIG. 4 is an outside perspective view of an impact sensor device to which the present invention is applied; FIG. 5 is a view of the device of FIG. 4 as seen from above; FIG. 6 is a sectional view seen along the line A-A of FIG. 5; and FIG. 7 is a view of the device of FIG. 4 as seen from the bottom.

The housing 2 of the airbag control system 1 is fabricated by plastic molding. The housing 2 is formed with an open bottom in structure. A circuit board 2 and a bottom cover 4 are mounted from the open bottom side. The circuit board 3, while not shown, mounts an impact sensor and an airbag ECU. Board mounting seats 7 and 8 for attaching the circuit board 3 and bottom cover 4 are provided inside the housing 2. Details of the board mounting seats 7 and 8 will be given later.

One side face of the housing 2 is open in structure. A connector 12 is attached in the opening 9. The connector 12 is connected with an airbag ECU mounted on the circuit board 3 and is arranged connectably with the outside through the opening 9.

Mounting brackets 6 are formed at three points at the bottom of the housing 2. The airbag control device 1 is fastened by screwing the mounting brackets 6 to a vehicle 5.

The impact caused at the vehicle 5 due to collision etc. is transmitted through the housing 2 to the circuit board 3. The impact sensor mounted on the circuit board 3 detects this and outputs the detection signal to the airbag ECU.

The airbag ECU judges the occurrence of impact based on the input signal. When judging that impact has occurred, it outputs an ignition signal for deploying the airbag for protecting the passenger. The operation of the airbag ECU is known, so the explanation will be omitted here.

The structure of the housing will be explained next.

Figure 8:
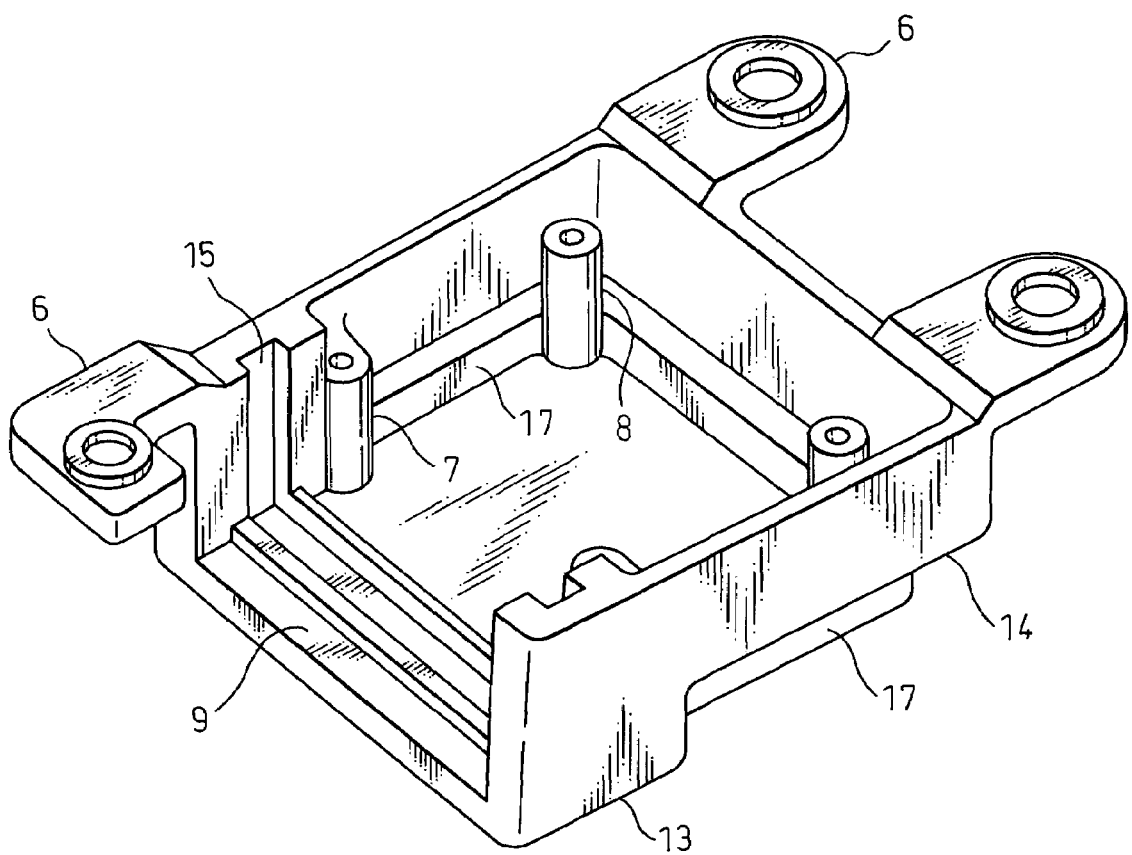
FIG. 8 is a view of the housing of the device of FIG. 4 in the state seen from the bottom at an angle.

FIG. 8 is a view of the housing 2 as seen from below at an angle.

The housing 2 has an opening 9 side used for the connector mount 13 and has a part deeper than the opening 9 used for a circuit board mount 14. Struts 17 are formed at the circuit board mount 14. The struts 17 will be explained later. One mounting bracket 6 is provided at the connector mount 13 side, and two are provided at the opposite side.

The inside walls of the connector mount 13 are formed with grooves 15 for mounting the connector 12. The method of mounting the connectors 12 utilizing the grooves 15 will be explained later.

The inside of the circuit board mount 14 is formed with four board mounting seats 7 and 8 for mounting the circuit board 3 facing the bottom of the housing 2. The circuit board 3 and the bottom cover 4, as shown in FIG. 6 and FIG. 7, are mounted by screws 11 utilizing the screw holes formed at the front ends of the board mounting seats 7 and 8.

Two board mounting seats 7 provided at the connector mount 13 side are formed integrally with the side walls of the housing 2 and the connector mount 13. The two board mounting seats 8 at the opposite side are provided at a space from the side wall of the housing 2.

Note that the number of the board mounting seats 7 and the number of the board mounting seats 8 may be freely set. For example, it is possible to provide one board mounting seat 7 formed integrally with the side wall of the housing 2 and three board mounting seats 8 provided at a space from the side wall of the housing 2.

Figure 9:
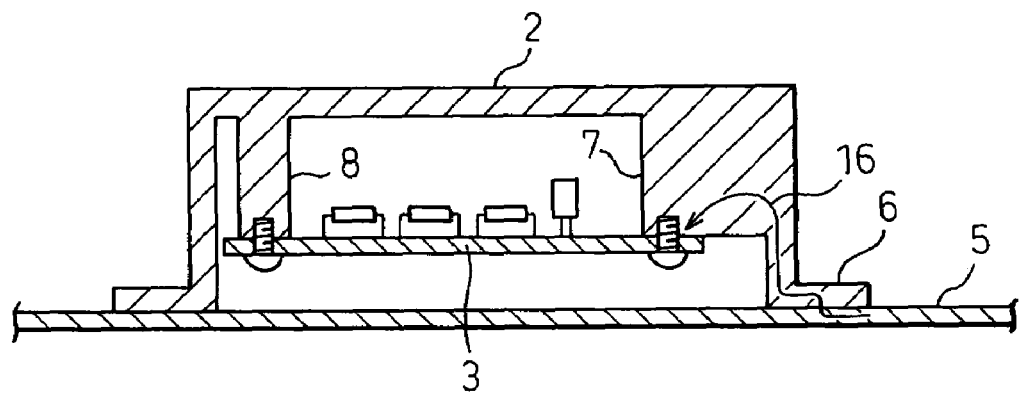
FIG. 9 is a view showing conceptually the structure of board mounting seats of an impact sensor device to which the present invention is applied.

FIG. 9 will be used to explain the structure of the board mounting seats 7 and the board mounting seats 8. FIG. 9 conceptually shows this for clarifying the difference between the board mounting seats 7 and the board mounting seats 8.

Each board mounting seat 7 is formed integrally with the connector mount 13 and the side wall of the housing 2, while each board mounting seat 8 is formed at a space from the side wall of the housing 2. Therefore, each board mounting seat 7 rigidly fixes the circuit board 3 to the housing 2, while each board mounting seat 8 flexibly fixes the circuit board 3 to the housing 2.

Impact passing through the board mounting seats 7 are transmitted as shown by the arrow 16. Due to the board mounting seats 7 being rigidly mounted to the housing 2, the impact from the vehicle 5 is efficiently transmitted from the circuit board 3 to the impact sensor. Further, the impact is efficiently transmitted since the distance from the mounting brackets 6 to the circuit board 3 is formed short.

As explained above, the housing 2 sometimes deforms due to the mounting heights and the state of surface precision of the mounting brackets 6, or the housing 2 sometimes deforms due to deformation of the vehicle 5 upon collision. If the housing 2 deforms, the mounting positions of the board mounting seats 7 and 8 move and force is applied deforming the circuit board 3. Further, when impact is transmitted to the housing 2, the wall of the housing 2 shakes. Due to this as well, the mounting positions of the board mounting seats 7 and 8 move and force is applied deforming the circuit board 3.

As opposed to this, by making a board mounting seats flexible in structure, the force deforming the circuit board 3 is eased. When deformation, shaking, etc. of the housing 2 act to make the mounting positions of the board mounting seats 7 and 8 move, the flexible structure board mounting seats 8 deform, whereby the force making the circuit board 3 deform is absorbed and the force applied to the circuit board 3 is reduced.

As explained above, according to this example, by forming part of the board mounting seats 7 rigid with respect to the housing 2, the efficiency of transmission of impact can be raised and the impact can be detected efficiently. Further, by making the remaining board mounting seats 8 flexible in structure with respect to the housing 2, even if the housing 2 deforms, shake, etc., the deformation is not transmitted to the circuit board and destruction etc. of the circuit board can be prevented.

FIG. 10 will be used to explain the method of mounting the connector 12. The figure shows the connector mount 13 as seen from the bottom.

As the method for mounting the connector 12 to the housing 2, any method may be applied, but below, two examples will be shown.

Figure 10A:
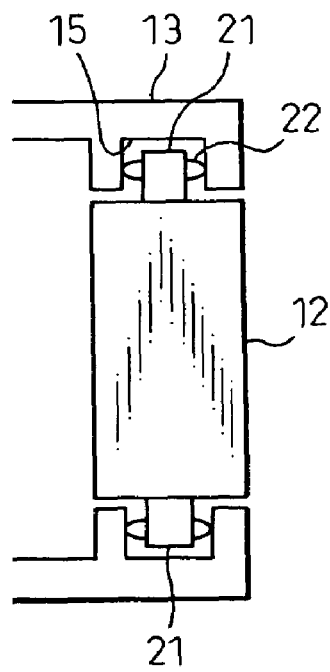
FIG. 10A and FIG. 10B are views for explaining the method of mounting a connector in the device of FIG. 4.

In the example of FIG. 10A, the inside walls of the connector mount 13 are formed with grooves 15 for connector mounting. On the other hand, the two side faces of the connector 12 are formed with a pair of projections 21 for engaging with the grooves 15 of the housing 2.

The projections 21 are further formed with pairs of projections 22 projecting to the two sides. The lengths between the tips of the pairs of projections 22 are set larger than the widths of the grooves 15.

When mounting the connector 12 to the housing 2, the projections 21 of the connector 12 engage with the grooves 15 from the bottom of the housing 2 and the connector 12 is pushed into the connector mount 13. At this time, the pairs of projections 22 engage with the inside surfaces of the grooves 15, whereby the connector 12 is held rigidly with the connector mount 13.

Figure 10B:
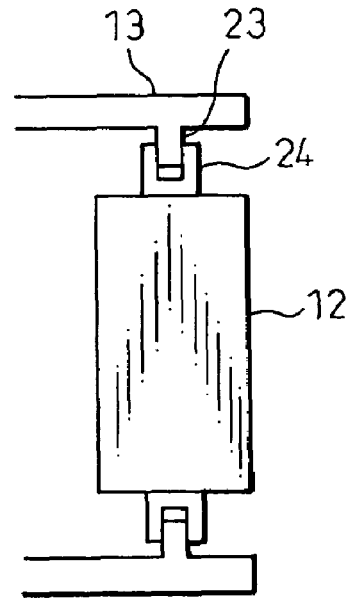

In the example of FIG. 10B, the inside surfaces of the connector mount 13 are formed with projections 23. The two side faces of the connector 12 are formed with members 24 having grooves for insertion of the projections 23.

When mounting the connector 12 to the housing 2, the projections 23 are engaged with the grooves of the member 24 and the connector 12 is pushed into the connector mount 13.

The relationship between the connector 12 and the circuit board 3 will be explained.

Normally, the connector 12 is mounted with the housing 2 in the state fixed and connected to the circuit board 3. In this case, when the connector 12 finishes being mounted, the circuit board 3 is positioned at the mounting positions of the board mounting seats 7 and 8. By fixing the circuit board 3 and bottom cover 4 to the board mounting seats 7 and 8 by the screws 11 in this state, the airbag control device 1 finishes being assembled.

The connector 12 and the circuit board 3 may be mounted separately to the housing 2. In this case, it is possible to first mount the connector 12 to the housing 2 and then mount the circuit board 3 or first mount the circuit board 3 to the housing 2 and then mount the connector 12. In either case, means are devised for automatic connection of the circuit board 3 and connector 12 in the state of completion of mounting.

Further, by rigidly mounting the connector 12 to the housing 2 and circuit board 3, the impact propagation path (arrow 16) from the mounting brackets 6 to the circuit board 3 explained in FIG. 7 is made further rigid in structure and the impact of the vehicle 5 can be transmitted to the impact sensor.

The struts 17 provided at the housing 2 will be explained next.

When impact is propagated through the housing 2, the walls shake. Due to this shaking, deviation occurs in the board mounting positions of the board mounting seats 7 and 8 and force is applied to cause the substrate 3 to deform. In this example, by providing struts 17 between the board mounting seats 7 and 8, shaking of the walls is prevented and force is prevented from being applied to the circuit board 3.

As shown in FIGS. 4 to 6 and FIG. 8, the connecting parts of the top part and sides of the housing 2 are formed with struts 17. The struts 17 are formed in shapes with the connecting parts between the top and sides of the housing 2 bent inward. The struts 17 are formed between the board mounting seats 7 and the board mounting seats 8 and between the board mounting seats 8. The pairs of board mounting seats 7 are made more rigid by mounting the connector 12, so the struts are omitted.

When impact is propagated to the housing 2 and impact is propagated between the board mounting seats 7 and 8, the presence of the struts 17 suppresses the shaking of the walls and application of deformation force to the circuit board 3 is prevented.

Note that the structure of the struts 17 is not limited to the illustrated example and may be made any structure. For example, it is possible to form struts 17 by attaching reinforcing members to the connecting parts between the top and sides of the housing 2. Further, it is also possible to form struts 17 between the board mounting seats 7 and 8 on the diagonal.

Above, an embodiment of the present invention was explained, but the present invention is not limited to an airbag control device. For example, it is possible to omit the airbag ECU mounted on the circuit board and utilizing the invention as an impact sensor device for outputting an output signal of the impact sensor to the outside. Further, instead of the airbag ECU, it is possible to apply the invention to a control device of another application mounting a microcomputer for another application, detecting impact, and performing control.

Further, it is also possible to apply the invention to a vibration sensor device mounting a vibration sensor for detecting vibration or another device for detecting force from the outside applied to a vehicle or behavior of the vehicle etc.

While the invention has been described with reference to specific embodiments chosen for purpose of illustration, it should be apparent that numerous modifications could be made thereto by those skilled in the art without departing from the basic concept and scope of the invention.

What is claimed is:

1. An airbag control device comprising:
   a circuit board for controlling an airbag in a vehicle, the circuit board having an airbag electronic control unit and an impact sensor thereon; and
   a housing containing the circuit board and being mounted on the vehicle, the housing being formed with an open bottom, side walls, a top wall, and first and second fixing members projecting from the top wall to the open bottom of the housing for fixing the circuit board, wherein the first fixing member is formed integrally with at least one of the side walls so as to efficiently transmit an impact from the vehicle to the impact sensor, and the second fixing member is formed separately from all of the side walls so as to absorb a force deforming the circuit board, and the housing has a strut formed between the first and the second fixing members.

2. The airbag control device as set forth in claim 1, wherein the housing has a side opening for attaching a connector.

3. The airbag control device as set forth in claim 1, wherein the first fixing members are placed at corners, close to the side opening, of the housing and the second fixing members are placed at the other corners of the housing.

4. The airbag control device as set forth in claim 1, wherein the housing has three mounting brackets for attaching the housing to the vehicle, one of the mounting brackets is placed close to the side opening and the other mounting brackets are placed at the opposite side from the side opening.

* * * * *